(12) United States Patent
Miwa

(10) Patent No.: US 7,590,906 B2
(45) Date of Patent: Sep. 15, 2009

(54) SCAN FLIP-FLOP CIRCUIT AND SEMICONDUCTOR INTEGRATED CIRCUIT DEVICE

(75) Inventor: Shunjiro Miwa, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 288 days.

(21) Appl. No.: 11/650,468

(22) Filed: Jan. 8, 2007

(65) Prior Publication Data

US 2007/0162802 A1    Jul. 12, 2007

(30) Foreign Application Priority Data

Jan. 11, 2006    (JP)    ............................. 2006-003588

(51) Int. Cl.
     *G01R 31/28*    (2006.01)

(52) U.S. Cl. ...................................... 714/726

(58) Field of Classification Search ................... 714/726
See application file for complete search history.

(56) References Cited

U.S. PATENT DOCUMENTS

| 6,938,225 B2 * | 8/2005 | Kundu ........................... 716/1 |
| 6,968,486 B2 | 11/2005 | Matsushima |
| 7,375,567 B2 * | 5/2008 | Branch et al. ................ 327/203 |

FOREIGN PATENT DOCUMENTS

JP    2002-189059    7/2002

* cited by examiner

*Primary Examiner*—James C Kerveros
(74) *Attorney, Agent, or Firm*—Young & Thompson

(57) ABSTRACT

Disclosed is a scan flip-flop that includes a latch section, a hold section, a first output node and a second output node. The latch section holds data. The hold section captures an inner state, responsive to a control signal, to hold an output state. The first output node outputs a first output signal based on the output state. The second output node outputs a second output signal based on the inner state.

9 Claims, 10 Drawing Sheets

FIG. 1 REFERENCE CASE

SCAN FLIP-FLOP CIRCUIT AND SEMICONDUCTOR INTEGRATED CIRCUIT DEVICE

FIELD OF THE INVENTION

This invention relates to a semiconductor integrated circuit device. More particularly, this invention relates to a scan flip-flop circuit which serves as a test circuit for a semiconductor integrated circuit device.

BACKGROUND OF THE INVENTION

A conventional testing of semiconductor integrated circuit devices (large-scale integrated circuits, referred to below as LSIs) is directed to the revealing of a stack at fault on a signal line. A stack at fault is such a fault in which the logical value of a signal is stuck at a certain value without dependency upon an input state of a circuit. It is a low-speed test technique in which mainly an open-circuit fault or a short-circuit fault of a signal line is modeled and in which degeneration of a signal line to "1" or "0" is presupposed. With the improvement of the integration technique, such as the shrinking of transistor size, the integration density as well as the operation clock frequency of up-to-date LSIs is increasing. Hence, delay faults, which cannot be detected with the low-speed test technique, are becoming non-negligible. The delay fault is such a fault in which the change in a signal is not propagated between flip-flops within prescribed time. It is produced due to delay in individual elements or in the interconnection between the elements.

A test for detecting delay faults is carried out by analyzing whether or not a signal output from an output flip-flop, out of two flip-flops arranged in a circuit, has been latched by an input flip-flop of the two flip-flops within a prescribed time. It is now supposed that a circuit including a NAND circuit 24 and an OR circuit 25, connected across flip-flops 21 and 22, as shown in FIG. 1, is tested. An input of the NAND circuit 24 is connected to an output of the flip-flop 21, while its other input holds the level "1" during the test. An input of the OR circuit 25 is connected to an output of the NAND circuit 24, while its other input holds the "0" level during the test. An output of the OR circuit 25 is supplied to the flip-flop 22 and thereby latched at a preset timing.

It is supposed that the flip-flops 21 and 22 capture input data at a preset interval and output the so captured data. The flip-flop 21 outputs "0" during the time period ti, while outputting "1" during the time period ti+1. The NAND circuit 24 outputs "0" after an interconnect delay between elements and an element delay of the NAND circuit 24 itself, as from the flip-flop 21 has output "1". The OR circuit 25 outputs "0" after an interconnect delay between elements and an element delay of the OR circuit 24 itself, as from the NAND circuit 24 has output "0". The flip-flop 22 receives "0" after an interconnect delay between elements as from the time the OR circuit 25 has output "0". If these delays are increased, an output of the OR circuit 25 does not get to the flip-flop 22 within the time period ti+1 which is the time as from outputting from the flip-flop 21 until latching by the flip-flop 22. Hence, if the flip-flop 22 cannot latch "0" after the time period ti+1 as from the time of outputting of the signal "1" from the flip-flop 21, it is decided that a delay fault has occurred between the flip-flops 21 and 22.

In this case, if a signal to be detected by the flip-flop 22 is not different from one latch timing to another, it cannot be determined whether or not a signal output from the flip-flop 21 has reached the flip-flop 22. It is therefore necessary to generate test data so that a value latched by the flip-flop 22 will differ from the value latched at the previous latch timing. That is, such a signal which takes different values to be received by the flip-flop 22 at two neighboring time points, referred to below as a two-pattern signal, needs to be set in the flip-flop 21.

There is known a scan-path method as a technique for facilitating LSI testing. In the scan path method, respective flip-flops in a circuit are connected in a serial chain and operates as a shift register. In testing, optional values are set from outside to the flip-flops, by utilizing the shift function and the results of the operation for these values are sampled by the flip-flops and delivered serially to outside. By observing the result of the operations, the circuit may be tested as to whether or not it is operating as normally.

For testing an LSI using the scan path method, a plural number of scan flip-flops, as flip-flops for test, are provided in the LSI. The aforementioned shift register may be composed by interconnecting input/output terminals of the scan flip-flops in series with one another. The scan flip-flops include, in addition to the normal operating function thereof as ordinary flip-flops, the scan operating function, in which the scan flip-flops operate as flip-flops constituting a shift register, which receives, as a data input, a scan-in signal SIN that is a pattern signal for testing and a scan clock SC as a clock for testing.

As a scan flip-flop, used for testing a semiconductor integrated circuit device (LSI), the JP Patent Kokai Publication No. JP-P2002-189059A describes the configuration of a master-slave scan flip-flop, including a master latch unit and a slave latch unit for temporarily holding an input signal. Referring to FIG. 2, the scan flip-flop includes a master latch section 1, a slave latch section 2, a first clock control section 3, a first scan control section 4, a second scan control section 5, a second clock control section 6 and a third scan control section 7. The scan flip-flop also includes inverters INV1 to INV7, as an output buffer and a transfer gate control signal generating circuit.

To the master latch section 1, the slave latch section 2, the first clock control section 3, and to the second clock control section 6, there are connected an output terminal P01 of the inverter INV3 for inverting a clock signal C, and an output terminal P02 of the inverter INV4 for inverting an output clock of the inverter INV3. To the master latch section 1 and the first scan control section 4, there are connected an input terminal H04 of a first scan clock SC1 and an output terminal P03 of the inverter INV5 inverting the first scan clock signal SC1. To the second scan control section 5 and to the third scan control section 7, there are connected an output terminal H05 of a second scan clock signal SC2 and an output terminal CB1 of the inverter INV6 inverting the second scan clock signal SC2.

An output data signal Q is output from the slave latch section 2 via a buffer circuit (inverter INV1) to a node N01. The slave latch section 2 outputs a scan-out signal SOT via a buffer circuit (inverter INV2) to a node N02. The output data signal Q and the scan-out signal SOT have phases reversed to each other.

The master latch section 1 includes inverters INV11 and INV12 and transfer gates TG11 and TG12, and temporarily hold a data signal D or the scan-in signal SIN. The inverter INV12 inverts an output signal of the inverter INV11 and outputs the so inverted signal. The transfer gates TG11 and TG12 are connected in series between an output of the inverter INV12 and an input of the inverter INV11. There are connected an output terminal P01 of the inverter INV3 and an output terminal P02 of the inverter INV4 to the transfer gate TG11, which is on/off controlled in synchronization with the clock signal C. There are connected the terminal H04 and the output terminal P03 of the inverter INV5 to the transfer gate TG12, which is on/off controlled in synchronization with the first scan clock signal SC1.

The slave latch section 2 includes inverters INV21 and INV22 and a transfer gate TG21, and temporarily holds an output signal of the master latch section 1 in synchronization with a clock signal C for normal operation or with the second scan clock signal SC2. The inverter INV22 inverts an output signal of the inverter INV21. The transfer gate TG21 is connected betweens an output of the inverter INV22 and an input of the inverter INV21. There are connected the output terminal P01 of the inverter INV3 and the output terminal P02 of the inverter INV4 to the transfer gate TG21, which is on/off controlled in synchronization with the clock signal C. An output signal of the inverter INV21 becomes the output data signal Q via the inverter INV1. An output signal of the inverter INV22 becomes the scan-out signal SOT through the inverter INV2. Also, an output signal of the inverter INV2 is fed back to the second clock control section 6 through a third scan control section 7.

The first clock control section 3 includes an inverter INV31 and a transfer gate TG31. The inverter INV31 inverts the data signal D. There are connected the output terminal P01 of the inverter INV3 and the output terminal P02 of the inverter INV4 to the transfer gate TG31, which is on/off controlled in synchronization with the clock signal C. The first clock control section 3 outputs the input data signal D to the master latch section 1 responsive to the clock signal C.

The first scan control section 4, receiving the scan-in signal SIN, includes a transfer gate TG41. There are connected the terminal H04 and the output terminal P03 of the inverter INV5 to the transfer gate TG41, which is on/off controlled in synchronization with the first scan clock signal SC1. The first scan control section 4 outputs the received scan clock signal SC1 to the master latch section 1, responsive to the first scan clock signal SC1.

The second scan control section 5, receiving an output signal of the master latch section 1, includes a transfer gate TG51. There are connected the terminal H05 and the output terminal CB1 of the inverter INV6 to the transfer gate TG51, which is on/off controlled in synchronization with the second scan clock signal SC2. The second clock control section 5 outputs an output signal of the master latch section 1 to the second clock control section 6, responsive to the second scan clock signal SC2.

The second clock control section 6, receiving an output signal of the second scan control section 5, includes a transfer gate TG61. There are connected the output terminal P01 of the inverter INV3 and the output terminal P02 of the inverter INV4 to the transfer gate TG61, which is on/off controlled in synchronization with the clock signal C. The second clock control section 6 outputs the output signal of the second scan control section 5 to the slave latch section 2, responsive to the clock signal C.

The third scan control section 7, receiving an output signal of the inverter INV22 of the slave latch section 2, includes a transfer gate TG71. There are connected the output terminal H05 and the output terminal CB1 of the inverter INV6 to the transfer gate TG71, which is on/off controlled in synchronization with the second scan clock signal SC2. The third scan control section 7 outputs the received output signal of the inverter INV22 to the second clock control section 6, responsive to the second scan clock signal SC2.

The master latch section 1, first clock control section 3 and the first scan control section 4 constitute a circuit for temporarily holding the input data signal D, responsive the clock signal C, while constituting a circuit for temporarily holding the scan-in signal SIN, responsive to the scan clock signal SC1. The slave latch section 2, second scan control section 5, second clock control section 6 and the third scan control section 7 constitute a circuit for temporarily holding the output signal of the master latch section 1, responsive to the clock signal C, while constituting a circuit for temporarily holding an output signal of the master latch section 1, responsive to the second scan clock signal SC2.

Each transfer gate is composed by a P-channel MOS transistor and an N-channel MOS transistor, in which a source and a drain of the P-channel MOS transistor are connected to a drain and a source of the N-channel MOS transistor. The transfer gate acts as a switch on/off controlled responsive to a control signal applied to the gates of the P-channel MOS transistor and the N-channel MOS transistor.

The operation of the conventional scan flip-flop will now be described. During the normal operation of the scan flip-flop, the first scan clock signal SC1 and the second scan clock signal SC2 are maintained at LOW level and at HIGH level, respectively. Thus, the transfer gate TG12 of the master latch section 1 and the transfer gate TG51 of the second scan control section 5 are maintained in an on-state, while the transfer gate TG41 of the first scan control section 4 and the transfer gate TG71 of the third scan control section 7 are maintained in an off-state.

In these states, the input data signal D (HIGH level or LOW level) is received from a terminal H01. When the clock signal C falls to LOW level, the transfer gate TG31 of the first clock control section 3 is rendered conductive, that is, turned on, while the transfer gate TG11 is rendered non-conductive, that is, turned off. Hence the input data signal D is supplied as input to the master latch section 1, through the transfer gate TG31. The master latch section 1 causes a signal, received from the first clock control section 3, to be inverted by inverter INV1, and outputs the so inverted signal to the second scan control section 5.

Since the second scan clock signal SC2 is at HIGH level, the transfer gate TG51 of the second scan control section 5 is maintained in an on-state, so that an output signal of the master latch section 1 is supplied as input to the second clock control section 6. Since the clock signal C is at LOW level, the transfer gate TG61 of the second clock control section 6 is in an off-state, and hence the transfer gate TG21 of the slave latch section 2 is in an on-state. Consequently, the slave latch section 2 keeps its internal state, such that its output signals Q and SOT remain unchanged.

When next the clock signal C rises to HIGH level, the transfer gate TG31 of the first clock control section 3 is rendered non-conductive, that is, turned off, while the transfer gate TG11 is rendered conductive, that is, turned on. Hence, the input data signal D ceases to be supplied to the master latch section 1, however, the output signal of the inverter INV12 is supplied via the transfer gates TG12 and TG11 to the input of the inverter INV11. That is, since the output signal of the inverter INV12 is fed back to the input of the inverter INV11, the master latch section 1 maintains a value (HIGH level or LOW level), directly previous to the rise of the clock signal C, as its internal state.

At this time, the transfer gate TG61 of the second clock control section 6 is rendered conductive, that is, turned on. The transfer gate TG21 of the slave latch section 2 is rendered non-conductive, that is, turned off, so that the slave latch section 2 captures an output of the master latch section 1, supplied from the second scan control section 5. The slave latch section 2 inverts a signal, received via the second clock control section 6, by the inverter INV21, and outputs the so inverted signal. This output signal is further inverted by the inverter INV1 so as to be output at terminal N01 as output data signal Q. This output signal is also inverted by the inverter INV22 so as to be output to the third scan control section 7 and to the inverter INV2. An output signal of the inverter INV2 is output from a node N02 as inverted output data signal QB or scan output signal SOT.

When the clock signal C rises to HIGH level again, the transfer gate TG61 of the second clock control section 6 is rendered non-conductive, that is, turned off, while the transfer gate TG21 of the slave latch section 2 is rendered conductive, that is, turned on. An output signal of the inverter INV21 is fed back via the inverter INV22 and transfer gate TG21 to an input of the inverter INV21. Hence, the slave latch section 2 holds its internal state it has taken in, with its output signals Q and SOT remaining unchanged.

The operation of the scan flip-flop at the time of the scan operation will now be described with reference to FIG. 3. During the scan operation, the clock signal C is maintained at HIGH level. Thus, the transfer gate TG11 of the master latch section 1 and the transfer gate TG61 of the second clock control section 6 are kept in a conductive state, that is, in an on-state, while the transfer gate TG31 of the first clock control section 3 and the transfer gate TG21 of the slave latch section 2 are kept in a non-conductive state, that is, in an off-state. Under these conditions, the scan-in signal SIN is supplied from the terminal H03. The scan-in signal SIN goes HIGH during a time period p1.

When the first scan clock signal SC1 rises to HIGH level (time period p2), the transfer gate TG41 of the first scan control section 4 is rendered conductive, that is, turned on, while the transfer gate TG12 of the master latch section 1 is rendered non-conductive, that is, turned off. Thus, the scan-in signal SIN is supplied through transfer gate TG11 to the inverter INV11. An output node Na of the inverter INV11 goes LOW. Since the second scan clock signal SC2 at this time is at LOW level, the transfer gate TG11 of the second scan control section 5 is in a non-conductive state, that is, in an off-state, so that the slave latch section 2 remains unchanged.

When the first scan clock signal SC1 rises to LOW level (time period t3), the transfer gate TG41 is in a non-conductive state, that is, turned off, while the transfer gate TG12 is in a conductive state, that is, turned on. An output signal of the inverter INV12 is fed back to an input of the inverter INV1, through transfer gates TG11 and TG12, and is kept at a value which prevailed when the first scan clock signal SC1 was at HIGH level, that is, just before the first scan clock signal SC1 transitioned to LOW level. That is, the master latch section 1 holds the state of the scan-in signal SIN it has taken in during the time period p2. The master latch section 1 keeps on holding this internal state as long as the first scan clock signal SC1 is at LOW level (time periods t3 through t5).

The second scan clock signal SC2 then rises to HIGH level (time period p4). The transfer gate TG51 of the second scan control section 5 then is conductive, that is, turned on, while the transfer gate TG71 of the third scan control section 7 then is non-conductive, that is, turned off. Hence, the second scan control section 5 supplies an output of the master latch section 1 through the transfer gate TG61 of the second clock control section 6 to the slave latch section 2.

The slave latch section 2 inverts the signal, received from the inverter INV21, to output the resulting signal to the inverter INV1, while supplying the signal to the inverter INV22. The inverter INV1 further inverts the signal to output the output data signal Q as an LOW level signal. The signal supplied to the inverter INV22 is inverted and supplied to the third scan control section 7 and to the inverter INV2. The inverter INV2 outputs the scan-out signal SOT, as a HIGH level signal, which is reverse phased with respect to the output data signal Q.

When the second scan clock signal SC2 falls to LOW level (timer period p5), the transfer gate TG51 is rendered non-conductive, that is, turned off, while the transfer gate TG51 is rendered conductive, that is, turned on. Hence, the signal supplied from the master latch section 1 is cut off, and the output signal of the inverter INV22 is supplied via the transfer gate TG71 to the second clock control section 6. The transfer gate TG61 supplies an output signal of the inverter INV22 to the inverter INV21. Hence, the output signal of the inverter INV21 is inverted by the inverter INV22 and fed back to the input of the inverter INV21 through transfer gates TG71 and TG61. Hence, the slave latch section 2 is kept at a value which prevailed when the second scan clock signal SC2 was at HIGH level, that is, just before the second scan clock signal SC2 was turned to LOW level. That is, the slave latch section 2 holds the state of the output signal of the master latch section 1 that was captured during the time period p4. This signal holding state is continued as long as the second scan clock signal SC2 is at LOW level (time periods p5 through p7).

Thus, with the conventional scan flip-flop, the scan-in signal SIN is sampled when the first scan clock signal SC1 is at HIGH level. The so sampled scan-in signal is temporarily retained in the master latch section 1. Also, in the conventional scan flip-flop, the slave latch section 2 takes over the internal state of the master latch section 1 when the second scan clock signal SC2 is at HIGH level, and the slave latch section 2 then outputs the internal state as the scan-out signal SOT. The conventional scan flip-flop repeats this sequence of operations to carry out the shift operations.

Referring to FIG. 4, a delay fault test, carried out in a scan path, made up of three stages of conventional scan flip-flops 14, 15 and 16, operated as described above, will now be described. The scan flip-flops 14, 15 and 16 are operated as a shift register, during the scan-pass test, as the scan-in terminals SIN and the scan-out terminals SOT thereof are connected with one another as shown. A combinational circuit 18 is connected between the scan flip-flops 14 and 15, whilst another combinational circuit 19 is connected between the scan flip-flops 15 and 16. The combinational circuit 18 carries out combinational logic operations on an output signal Q14 of the scan flip-flop 14, to output a signal D18 representing the result of the operations. The combinational circuit 19 carries out combinational logic operations on an output signal Q15 of the scan flip-flop 15, to output a signal D19 representing the result of the operations. The clock signal C, first scan clock signal SC1 and the second scan clock signal SC2 are supplied in common to the scan flip-flops 14 to 16. When the scan flip-flops 14 to 16 are operated as shift register, a scan-in signal SI and a scan-out signal are serially input and output, respectively.

FIG. 5 is a timing chart showing the operation of a conventional delay fault test. For the scan flip-flops, test data of patterns "A", "B" and "C" are set. For setting the test data for the respective scan flip-flops, the first scan clock signal SC1 and the second scan clock signal SC2 are supplied. That is, HIGH level pulses SC1a, SC2a, SC1b, SC2b, SC1c and SC2c are applied as shift clocks for the respective scan flip-flops ((b) and (c) of FIG. 5). The clock signal C is kept at this time at HIGH level ((a) of FIG. 5). The test data "A", "B" and "C" are shifted in order from the scan flip-flop 14 to the scan flip-flop 15 and from the scan flip-flop 15 to the scan flip-flop 16, in synchronization with the rising of the pulses SC2a, SC2b and SC2c, respectively ((e), (g) and (i) of FIG. 5). It is noted that data received at the scan-in terminal SIN (node H03) are output at the output data terminal Q (node N01) with inverted polarity and hence are designated with suffixes n.

At a rise time point of the pulse SC2c, test data "C", "B" and "A" are set in the scan flip-flops 14, 15 and 16, respectively. The clock signal C is once set to LOW level, at a preset timing Ca, in order to operate the circuit with first pattern data ((a) of FIG. 5). Each scan flip-flop captures data from the input data signal terminal D (node H01) when the clock signal C is at LOW level. When the clock rises to HIGH level, the scan flip-flop outputs the data as output data signal Q. Thus, the output data signal Q14, output from the scan flip-flop 14, is changed to "Dn" which has been applied to the input data terminal D of the scan flip-flop 14 ((e) of FIG. 5). An output data signal Q16, output from the scan flip-flop 15, is changed to "C1n", by taking in a result signal D18 representing the result of operation by the combinational circuit 18 on the output data signal Q14="Cn" of the scan flip-flop 14 ((g) of FIG. 5). The scan-out signal SO, output from the scan flip-flop 16, is changed to "B2" by taking in a result signal D19 representing the result of operation by the combinational circuit 19 on the output data signal Q15="Bn" of the scan flip-flop 15 ((i) of FIG. 5).

At a timing Cb after lapse of a preset time T as from timing Ca, the clock signal C again becomes LOW level. The output data signal Q14, output from the scan flip-flop 14, is changed to "EN" so far applied to the input data terminal D of the scan flip-flop 14 ((e) of FIG. 5). An output data signal Q16, output from the scan flip-flop 15, is changed to "D1n", by taking in a result signal D18 representing the result of operation by the combinational circuit 18 on the output data signal Q14="Dn" of the scan flip-flop 14 ((g) of FIG. 5). The scan-out signal SO, output from the scan flip-flop 16, is changed to "C2", by taking in a result signal D19 representing the result of operation by the combinational circuit 19 on the output data signal Q15="C1n" of the scan flip-flop 15 ((i) of FIG. 5).

When the clock signal C reverts to HIGH level, the second scan clock signal SC2 becomes LOW level. The master latch units 1 and the slave latch units 2 of the respective scan flip-flop retain their respective states ((c) of FIG. 5). The first scan clock signal SC1 and the second scan clock signal SC2 then apply pulses SC1d, SC2d, SC1e and SC2e to the respective scan flip-flops in order to serially output the test results set in the respective scan flip-flops. The output data signal Q15 of the scan flip-flop 15 is changed to "D1n" and then into "En", in synchronization with the rising of the pulses SC2d and SC2e, while the scan-out signal SO of the scan flip-flop 15 is changed to "C2", then to "D1" and then to "E". That is, the values at capturing time points when the second clock signal C has become LOW are serially output in order as the scan-out signal SO.

The sampled value at the rise time points of the second clock signal C represent a test result of the delay fault test. That is, input data for a circuit being tested need to be supplied so that the output of the circuit being tested for delay fault will be changed. Since the circuit being tested is the combinational circuit 19, the data "C2n" output on inputting "C1n" must be different from the data "D2n" output on inputting "D1n". The data "D1n" is the result of operation by the combinational circuit 18 on the output signal Q14 of the scan flip-flop 14. Hence, in testing the combinational circuit 19, it is necessary to perform reverse-operation with respect to the operation executed by the combinational circuit 18 to find test data to be supplied to the scan flip-flop 14.

[Patent Document 1] JP Patent Kokai Publication No. JP-P2002-189059A

SUMMARY OF THE DISCLOSURE

In carrying out a delay fault test, it is necessary for an output side flip-flop, out of two flip-flops, being the subject to delay fault testing, to output two signal patterns so that different signal values will be received at two consecutive time points. Hence, in carrying out a delay fault test, one of the two signal patterns is stored in a flip-flop 15, and the second signal pattern is applied from a flip-flop 14 arranged on a forward stage with respect to the flip-flop 15. In short, it is necessary that the state of a circuit at a time point going back by one clock cycle be optionally set. In this case, the signal patterns are generated by a sequential circuit. It has been known to be mathematically difficult to generate signal patterns for delay fault testing by a sequential circuit. Accordingly, it is an object of the present invention to provide a scan flip-flop that is able to apply two signal patterns for delay fault test at the time of delay fault testing.

The above and other objects are attained by the present invention having a configuration summarized as follows. In the following, reference numerals and symbols are affixed in order to clarify the relationship of correspondence between the claims and the mode for carrying out the invention. These numerals and symbols should be construed in a limiting fashion and should not be used for interpreting the technical scope of the invention as defined in the claims.

A scan flip-flop circuit in accordance with one aspect of the present invention includes a latch section (1 to 7), a hold section (8 and 9), a first output node (N01) and a second output node (N02). The latch section (1 to 7) holds data. The hold section (8 and 9) captures an inner state of the latch section (1 to 7), based on a control signal (H), to hold an output state. The first output node (N01) outputs a first output signal (Q) based on the output state. The second output node (N02) outputs a second output signal (SOT) based on the inner state.

A semiconductor integrated circuit device in accordance with another aspect of the present invention includes a scan flip-flop having a hold section (8 and 9) for holding an output state responsive to a control signal (H).

The meritorious effects of the present invention are summarized as follows.

According to the present invention, there may be provided a scan flip-flop capable of applying two signal patterns for delay fault testing. Hence, the signal patterns for delay fault testing may be generated easily within a shorter time.

Still other features and advantages of the present invention will become readily apparent to those skilled in this art from the following detailed description in conjunction with the accompanying drawings wherein only the preferred embodiments of the invention are shown and described, simply by way of illustration of the mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTIONS OF THE DRAWINGS

Figure 1:
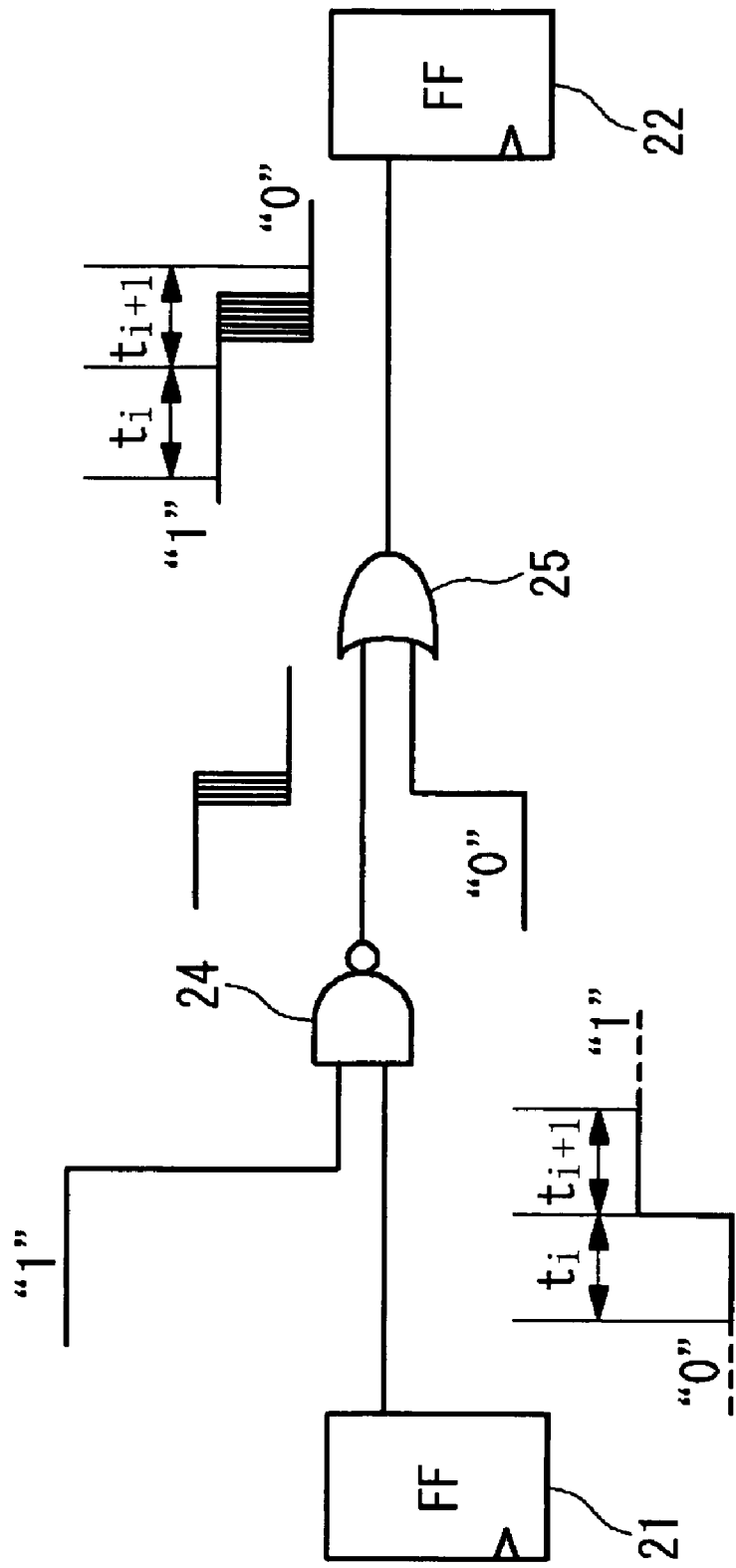
FIG. 1 is a schematic circuit diagram for illustrating two patterns used in a delay fault test.
Figure 2:
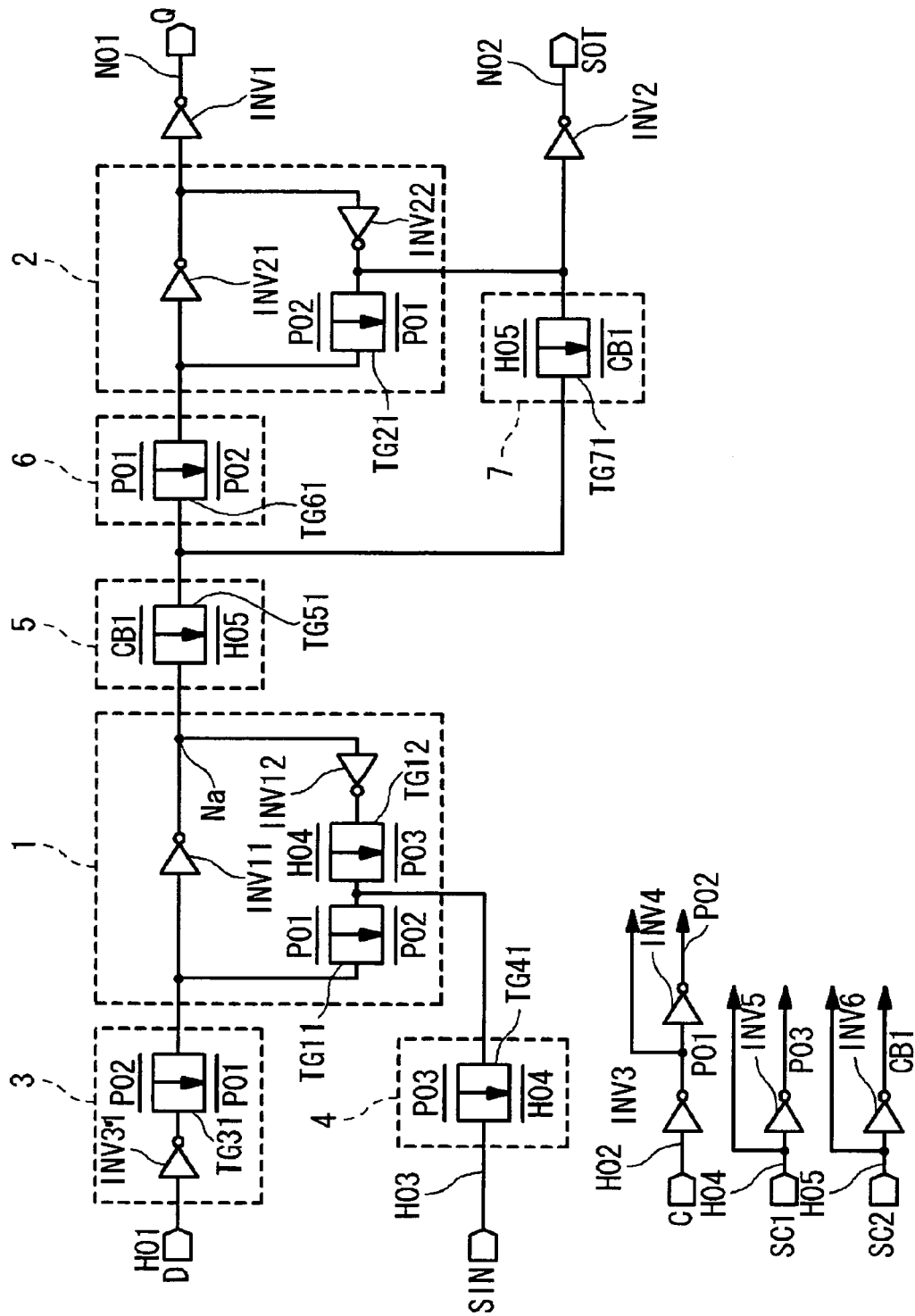
FIG. 2 is a circuit diagram showing a typical circuit of a conventional scan flip-flop.
Figure 3:
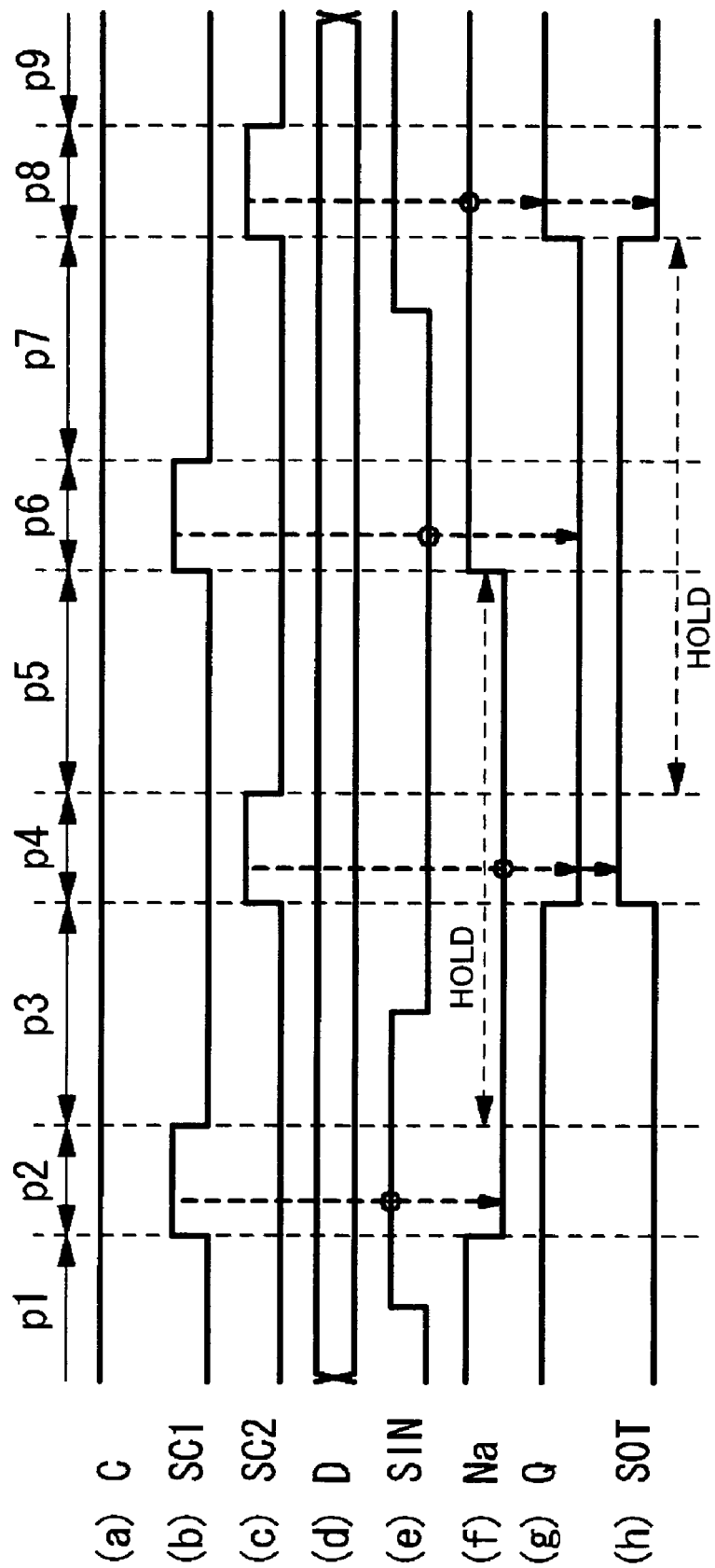
FIG. 3 is a timing chart for illustrating the shift operation of the scan flip-flop.
Figure 4:
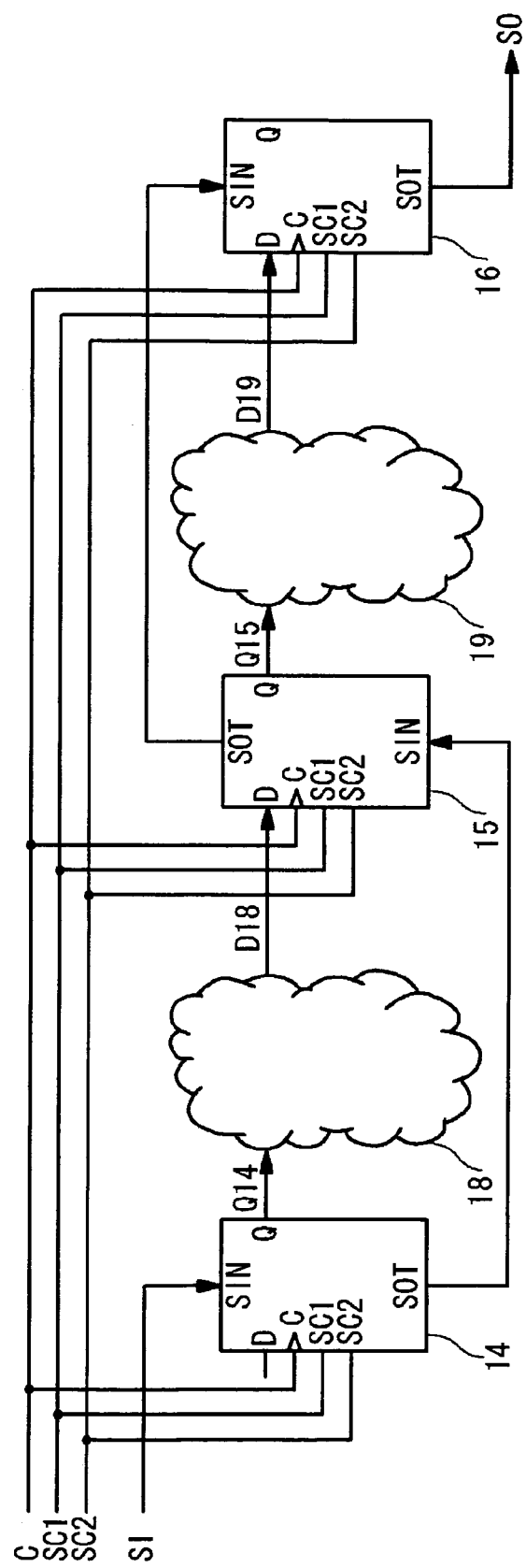

FIG. 4 schematically shows an illustrative configuration for delay fault testing employing the scan flip-flop.

Figure 5:
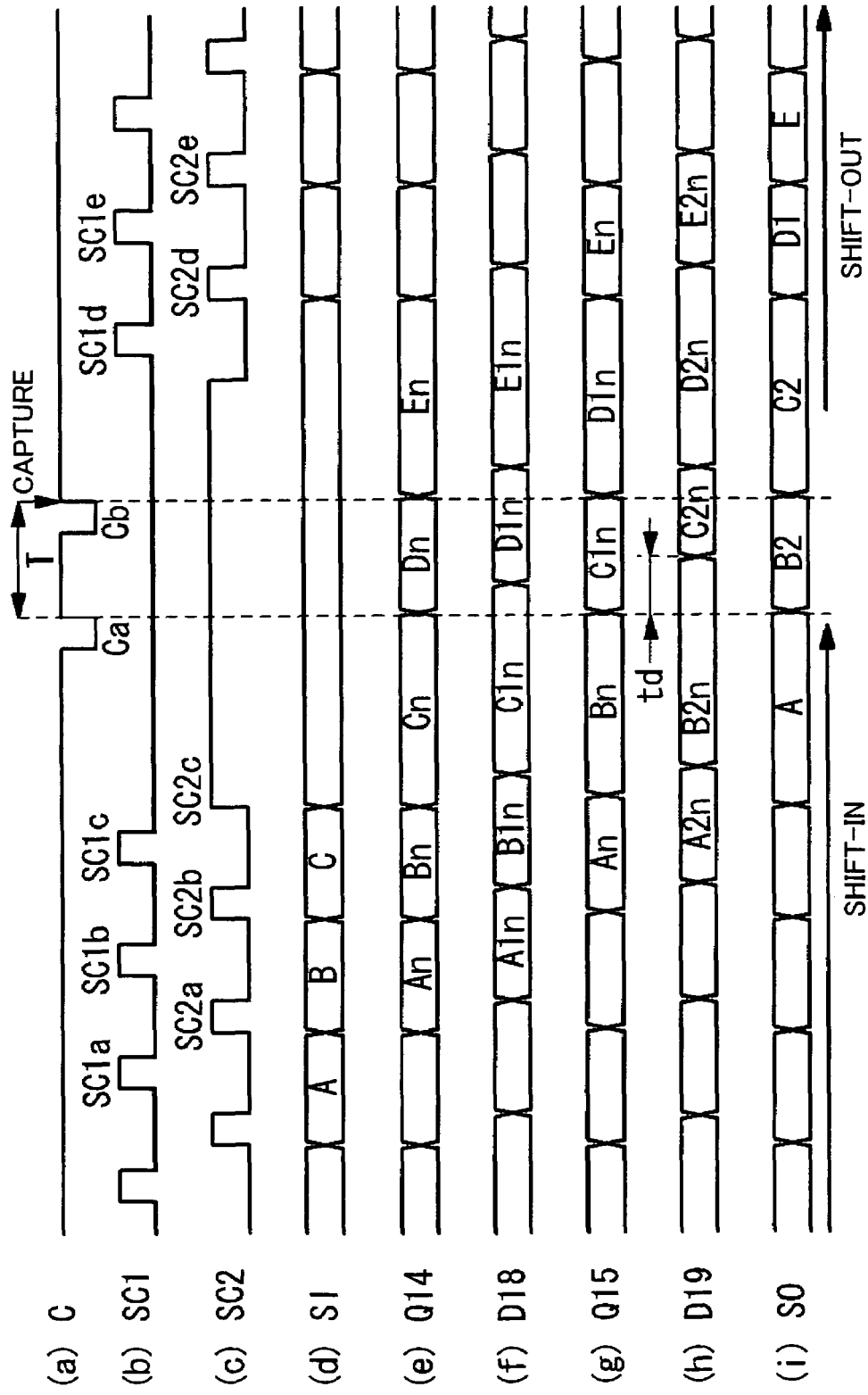

FIG. 5 is a timing chart for illustrating the operation of the delay fault test employing the scan flip-flop.

Figure 6:
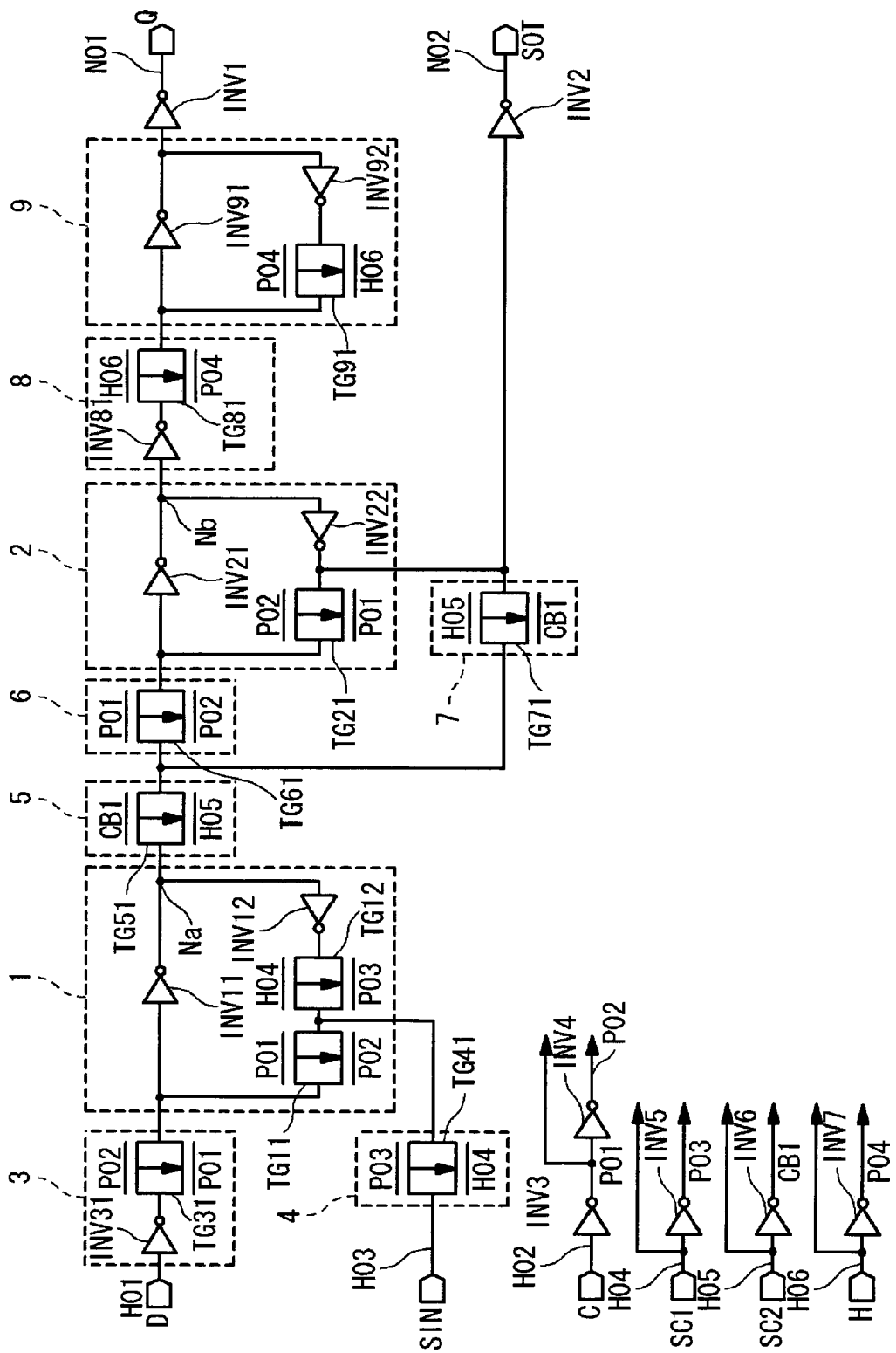

FIG. 6 is a circuit diagram showing an illustrative circuit of the scan flip-flop embodying the present invention.

Figure 7:
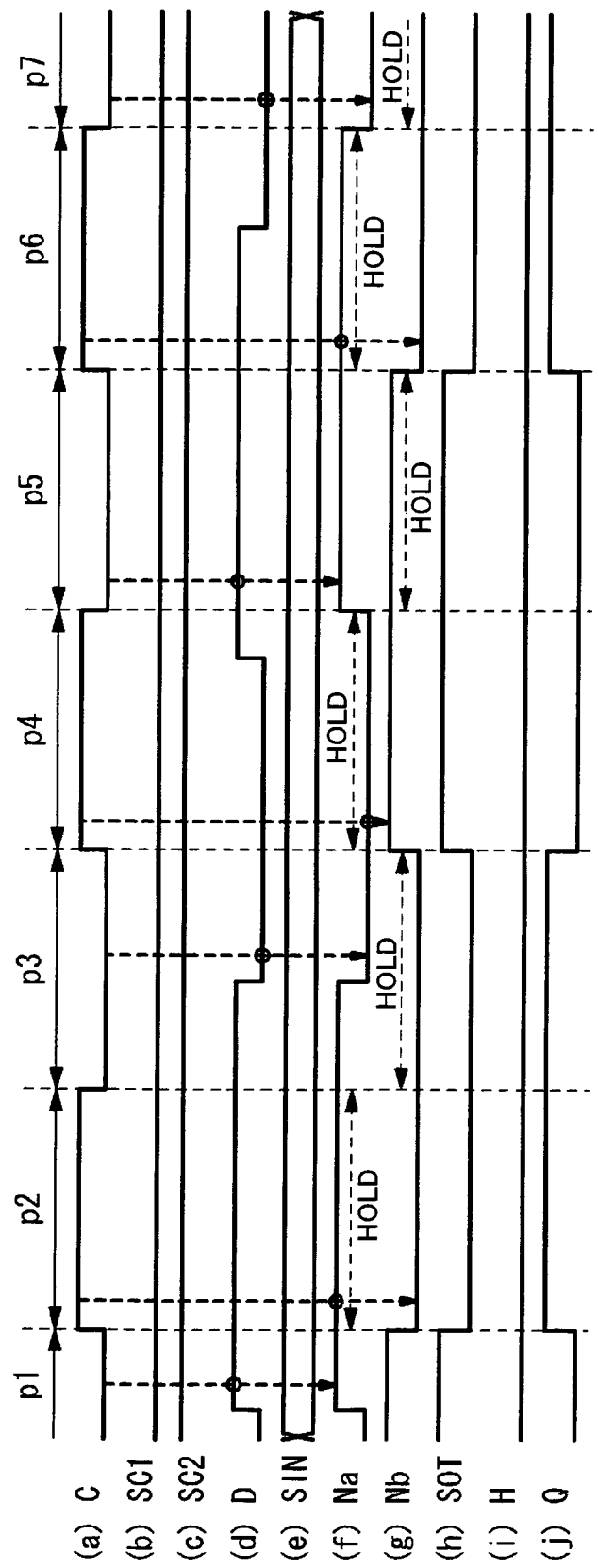

FIG. 7 is a timing chart for illustrating the operation at the time of the normal operation of the scan flip-flop.

Figure 8:
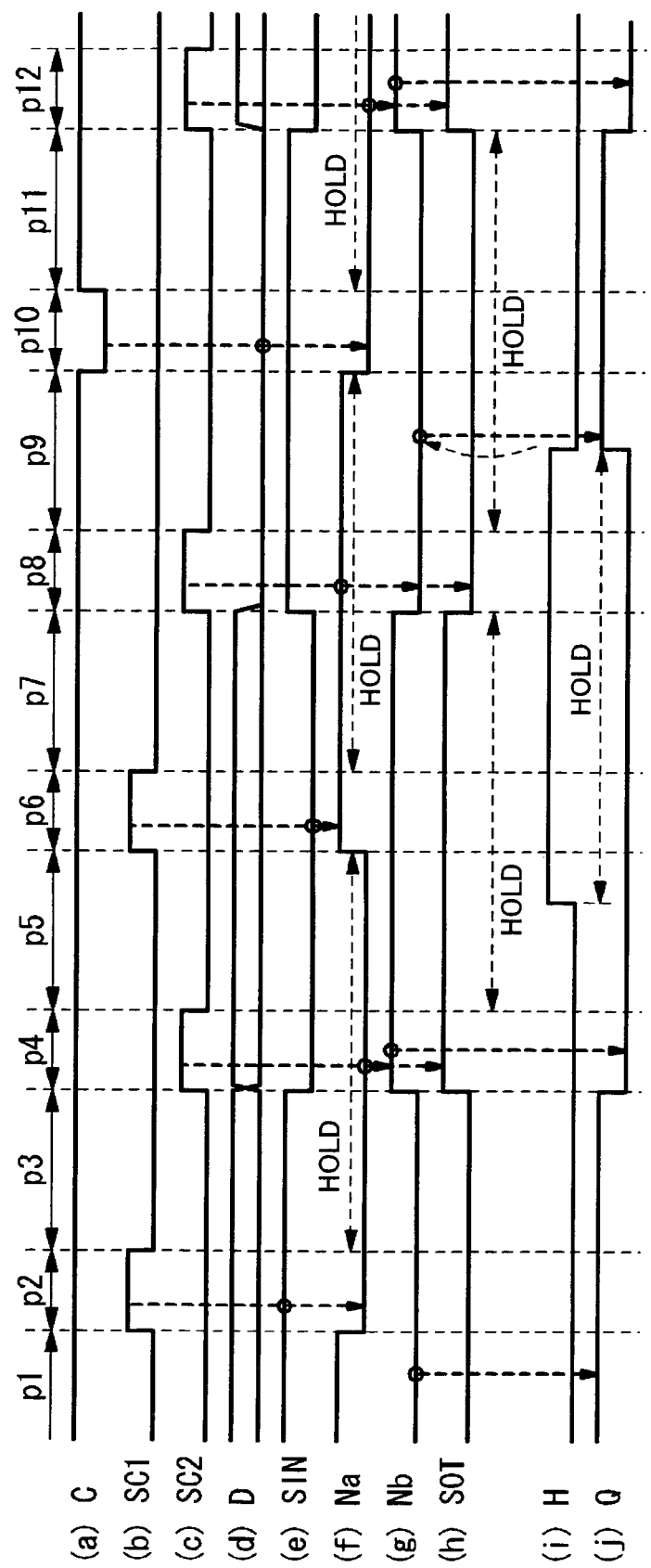

FIG. 8 is a timing chart for illustrating the operation at the time of scan path testing of the scan flip-flop.

Figure 9:
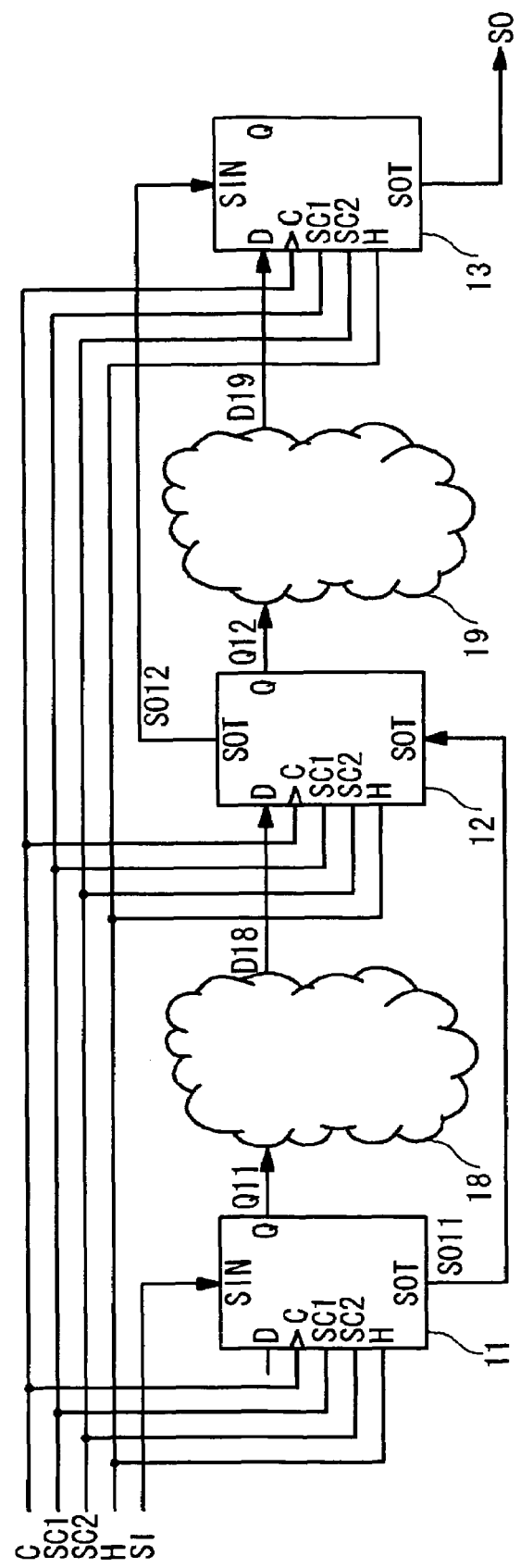

FIG. 9 schematically shows an illustrative configuration for delay fault testing employing the scan flip-flop.

Figure 10:
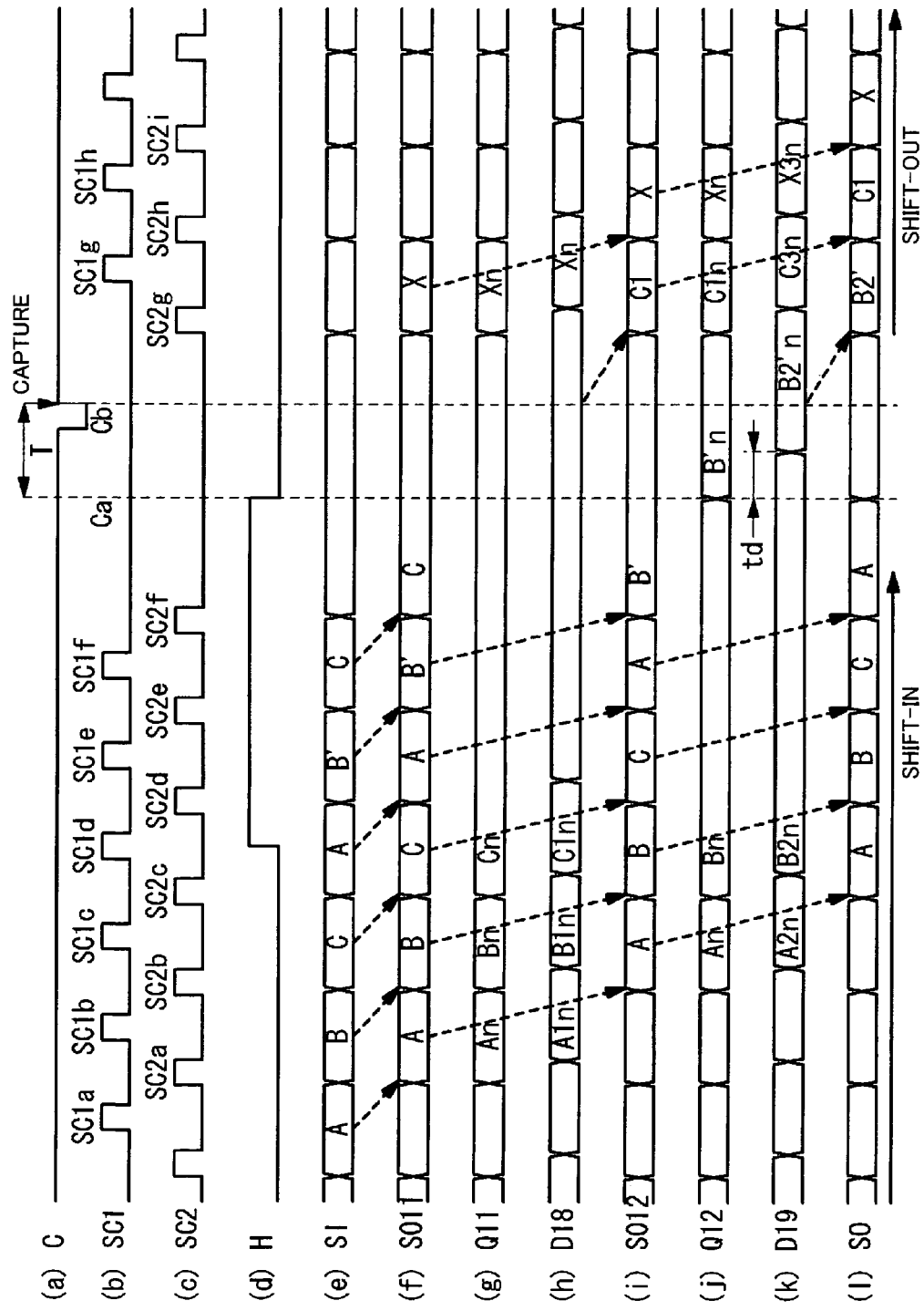

FIG. 10 is a timing chart for illustrating the operation at the time of delay fault testing employing the scan flip-flop.

DETAILED DESCRIPTION OF THE INVENTION

The present invention will now be described with reference to the drawings. FIG. 6 is a circuit diagram showing the circuit configuration of a scan flip-flop embodying the present invention. The scan flip-flop is a master-slave scan flip-flop including a master part for temporarily holding an input signal and a slave part having two latches. During the normal operation, the scan flip-flop operates as a D-flip-flop.

Referring to FIG. 6, the scan flip-flop includes, in its master part, a master latch section 1, a first clock control section 3 and a first scan control section 4, while including, in its slave part, a slave latch section 2, a second slave latch section 9, a second scan control section 5, a second clock control section 6, a third scan control section 7, a fourth scan control section 8 and inverters INV1, INV2. The scan flip-flop also includes inverters INV3 to INV7 as a clock control section.

The master part captures and holds an input data signal D or a scan-in signal S1N, under control by the clock control section. The slave part captures and holds a signal, output from the master part, under control by the clock control section, to output an output data signal Q and a scan-out signal SOT. The clock control section receives a clock signal C, a first scan clock signal SC1, a second scan clock signal SC2 and a hold signal H from terminals H02, H04, H05 and H06, respectively.

The inverter INV3 outputs an inverted clock signal, to a node P01, based on a clock signal C, while the inverter INV4 outputs a clock signal, which is in phase with the clock signal C, to a node P02. The inverter INV5 inverts the first scan clock signal SC1, received by the node H04, to output the inverted clock at a node P03. The inverter INV6 inverts the second scan clock signal SC2, received at the node H05, to output the inverted clock at a node CB1. The inverter INV7 inverts the hold signal H, received from a node H06, to output the inverted signal to a node P04. These paired clock signals and control signals are supplied to the transfer gates.

The first clock control section 3 includes an inverter INV31 and a transfer gate TG31. The inverter INV31 inverts the polarity of the input data signal D, received from the terminal H01, and outputs the resulting signal to the transfer gate TG31. The transfer gate TG31 is controlled, based on the clock signal C, and supplies an output of the inverter INV31 to the master latch section 1.

The first scan control section 4 includes a transfer gate TG41. The transfer gate TG41 is controlled, based on the first scan clock signal SC1, such that, when the first scan clock signal SC1 is at HIGH level, the scan-in signal SIN, received by the input node H03, is supplied to the master latch section.

The master latch section 1 includes inverters INV11 and INV12 and transfer gates TG11 and TG12. Since the transfer gates TG11 and TG31 are controlled based on control signals reverse phased to each other, the inverter INV11 inverts the polarity of a signal supplied from the transfer gate TG11 or the inverted input data signal D, received from the first clock control section 3, to output the resulting signal to a node Na. This node Na is connected to the inverter INV12 and to the second scan control section 5. The inverter INV12 inverts the polarity of an output of the inverter INV11 to output the resulting signal to a transfer gate TG12. This transfer gate TG12 is controlled, based on the first scan clock signal SC1, such that, when the first scan clock signal SC1 is LOW, an output of the inverter INV12 is supplied to the transfer gate TG11. Since the transfer gate TG12 and the transfer gate TG41 of the first scan control section 4 are controlled based on control signals reverse phased to each other, derived from the first scan clock signal SC1, the scan-in signal SIN or the signal output from the inverter INV12 is supplied to the transfer gate TG11.

Thus, when the first scan clock signal SC1 is LOW, the master latch section 1 captures the input data signal D to output the signal to the second scan control section 5 when the clock signal C is LOW. When the clock signal C is HIGH, the inverters INV11 and INV12 are interconnected in series to constitute a loop, with the master latch section 1 holding an input signal and outputting the signal to the second scan control section 5.

Thus, when the clock signal C is HIGH, the master latch section 1 captures the scan-in signal SIN when the first scan clock signal SC1 is HIGH, and outputs to the second scan control section 5 a signal inverted in polarity. When the first scan clock signal SC1 is LOW, the inverters INV11 and INV12 are interconnected in series to constitute a loop, with the master latch section 1 holding the input signal and outputting the signal to the second scan control section 5.

The second scan control section 5 includes a transfer gate TG51 controlled based on the second scan clock signal SC2. When the second scan clock signal SC2 is HIGH, the transfer gate TG51 supplies the output signal from the master latch section 1 to the second clock control section 6.

The second clock control section 6 includes the transfer gate TG61, controlled based on the clock signal C. When the clock signal C is HIGH, the transfer gate TG61 supplies the input signal to the slave latch section 2.

The slave latch section 2 includes inverters INV21, INV22 and a transfer gate TG21. The transfer gate TG21 is controlled based on the clock signal C, such that, when the clock signal C is LOW, an output of the inverter INV22 is supplied to the inverter INV21. Since the transfer gate TG12 and the transfer gate TG61 are controlled based on control signals reverse phased to each other, derived from the first scan clock signal SC1, the inverter INV21 inverts the polarity of a signal supplied from the second clock control section 6 or a signal supplied from the transfer gate TG21 to output the resulting signal to a node Nb. To the node Nb are connected the inverter INV22 and the fourth scan control section 8. The inverter INV22 inverts the polarity of the output of the inverter INV21 to output the resulting data to the transfer gate TG21 and to the third scan control section 7, while outputting the scan-out signal SOT via the inverter INV2 to the node N02. This scan-out signal SOT is in phase with the signal at the node Nb.

The third scan control section 7 includes the transfer gate TG71 controlled based on the second scan clock signal SC2. When the second scan clock signal SC2 is LOW, the transfer gate TG71 supplies an output of the inverter INV22 to the second clock control section 6.

The transfer gate TG51 of the second scan control section 5 and the transfer gate TG71 of the third scan control section 7 are controlled by control signals reverse phased to each other, derived from the second scan clock signal SC2, the signal output from the master latch section 1 or the signal held by the slave latch section 2 and output from the inverter INV22 is supplied to the second clock control section 6.

Thus, when the clock signal C is HIGH, the slave latch section 2 captures a signal output from the master latch section 1 in case the second scan clock signal SC2 is HIGH. When the second scan clock signal SC2 is LOW, the inverters INV21, INV22 make up a loop. Hence, the slave latch section 2 shuts off an input to hold the captured signal.

Moreover, when the second scan clock signal SC2 is HIGH, the slave latch section 2 captures a signal output from the master latch section 1 in case the clock signal C is HIGH. When the clock signal C is LOW, the inverters INV21, INV22 make up a loop. Hence, the slave latch section 2 shuts off an input to hold the captured signal.

The fourth scan control section 8 includes an inverter INV81 and a transfer gate TG81. The inverter INV81 inverts the polarity of an output signal from the slave latch section 2 to supply the resulting signal to the transfer gate TG81. This transfer gate TG81 is controlled based on the hold signal H, so that, when the hold signal H is LOW, the transfer gate TG81 supplies the output of the inverter INV81 to the second slave latch section 9.

The second slave latch section 9 includes inverters INV91 and INV92 and a transfer gate TG91. The inverter INV92 inverts the polarity of the inverter INV91 to output the resulting signal to the transfer gate TG91. This transfer gate TG91 is controlled based on the hold signal H, such that, when the hold signal H is HIGH, the transfer gate TG91 supplies an output of the inverter INV92 to the inverter INV91. The transfer gate TG91 and the transfer gate TG81 of the fourth scan control section 8 are controlled based on signals reverse phased to each other, which have been derived from the hold signal H. Consequently, the inverter INV91 inverts the polarity of an output signal of the inverter INV92 or an output signal of the inverter INV81 to supply the resulting signal to the inverter INV92 and to the inverter INV1. The inverter INV1 inverts the polarity of the input signal to output the resulting signal from the node N01 as output data signal Q of the scan flip-flop.

Thus, when the hold signal H is LOW, the second slave latch section 9 captures and outputs an output of the slave latch section 2. When the hold signal H is HIGH, the inverters INV91 and INV92 make up a signal loop to hold an input signal. That is, the output data signal Q and the scan-out signal SOT operate in synchronization to output signals reverse phased to each other, as in a conventional scan flip-flop in which an output of the slave latch section 2 is supplied via the inverter INV1, when the hold signal H is LOW. When the hold signal H is HIGH, the scan-out signal SOT reflects the state of the slave latch section 2, however, the output data signal Q holds a value which prevailed immediately before rising of the hold signal H. When the hold signal H falls, the output data signal Q becomes a signal which reflects the state of the slave latch section 2.

Thus, it becomes possible to hold two signal patterns for delay fault testing and to output the patterns based on the hold signal H, by the second slave latch section 9 and the fourth scan control section controlled by the hold signal H.

The operation of the scan flip-flop will now be described with reference to the drawings. FIG. 7 is a timing chart for illustrating the operation of the scan flip-flop during the normal operation. During the normal operation, the first scan clock signal SC1 and the second scan clock signal SC2 are fixed at LOW level and at HIGH level, respectively, as shown (b) and (c) of FIG. 7. Hence, the transfer gates TG12 and TG51 are in a conductive state (on-state), while the transfer gates TG41 and TG71 are in a non-conductive state (off-state). The scan-in signal SIN is cut off by the transfer gate TG41 and hence does not affect the flip-flop operation ((e) of FIG. 7). On the other hand, the hold signal H is fixed at LOW level, as shown (i) of FIG. 7. An output of the slave latch section 2 is directly supplied through the fourth scan control section 8 and the second slave latch section 9.

The clock signal C is LOW during the time periods p1, p3, p5 and p7, while being HIGH level during time periods p2, p4 and p6, as shown (a) of FIG. 7. Such a case will now be described in which the input data signal D rises during the time periods p1 and p4, and remains HIGH level during the periods p2 and p5 to fall during the periods p3 and p6, as indicated (d) of FIG. 7.

During the time period p1, the transfer gate TG31 is in a conductive state. Thus, the input data signal D, which is HIGH, sets the node Na to HIGH level through the inverters INV31 and INV11. On the other hand, the transfer gate TG61 is in a non-conductive state, with the slave latch section 2 holding an HIGH level signal ((g) of FIG. 7). Hence, the output data signal Q of the scan flip-flop is at LOW level, with the scan-out signal SOT being at HIGH level.

During the time period p2, the clock signal C is at HIGH level. Hence, the transfer gate TG31 is in a non-conductive state, and the transfer gate TG11 is in a conductive state, with the master latch section 1 holding the captured signal. Hence, the node Na is kept in the HIGH level ((f) of FIG. 7). On the other hand, the transfer gate TG61 is in a conductive state, while the transfer gate TG21 is in a non-conductive state. Thus, the slave latch section 2 captures an output of the master latch section 1 to output an LOW level signal from the node Nb ((g) of FIG. 7). Hence, the output data signal Q is HIGH, while the scan-out signal SOT becomes LOW level ((j) and (h) of FIG. 7).

During the time period p3, the master latch section 1 captures the input data signal D, as during the time period p1, with the node Na becoming LOW ((f) of FIG. 7). In the slave latch section 2, the node Nb holds the captured LOW level ((g) of FIG. 7).

During the time period p4, the master latch section 1 keeps the level of the captured signal ((f) of FIG. 7). The slave latch section 2 captures the output of the master latch section 1, with the node Nb becoming HIGH level ((g) of FIG. 7). During the time period p4, the input data signal D rises to the HIGH level. However, the master latch section 1 is in a latching state, with the node Na not being changed in level ((f) of FIG. 7).

During the time period p5, the master latch section 1 captures the input data signal D, so that the node Na becomes HIGH level ((f) of FIG. 7). The slave latch section 2 holds the state of the time period p4 and hence the node Nb keeps the HIGH level state ((g) of FIG. 7).

During the time period p6, the master latch section 1 keeps the level of the captured signal, as during the time period p4, with the node Na keeping the HIGH level despite falling of the input data signal D ((f) of FIG. 7). The slave latch section 2 captures the output of the master latch section 1, with the node Nb becoming LOW ((g) of FIG. 7).

Thus, during the normal operation, the scan flip-flop outputs the level of the input data signal D, which prevailed immediately before the rising of the clock signal C, as the output data signal Q, while outputting a polarity-inverted signal as the scan-out signal SOT, in the same way as the conventional scan flip-flop.

Referring to FIG. 8, the operation of the scan flip-flop during the scan-path test will be described. If, in the scan-path testing, the scan flip-flops are operated as a shift register, the clock signal C is fixed at HIGH level ((a) of FIG. 8). The first scan clock signal SC1 and the second scan clock signal SC2 are applied as two-phase shift clock signals, the HIGH level periods of which are not overlapped with one another ((b) and (c) of FIG. 8). In the operation of the circuit being tested, data is sampled by the clock signal C once becoming LOW, so that the data is then taken in by the transfer gates TG31 and TG21. During the HIGH level period of the clock signal C, the transfer gates TG31 and TG21 are in a non-conductive state (in an off-state), with the transfer gates TG11 and TG61 being in a conductive state (in an on-state).

During the time period p1, the first scan clock signal SC1 and the second scan clock signal SC2 are both LOW ((b) and (c) of FIG. 8). Hence, the master latch section 1 and the slave latch section 2 are both in data holding states, so that the node Na and Nb keep the HIGH level ((f) of FIG. 8) and the LOW level ((g) of FIG. 8), respectively. The scan-out signal SOT is at LOW level to reflect the level of the node Nb ((h) of FIG. 8). The output data signal Q is at HIGH level ((j) of FIG. 8).

During the time period p2, the first scan clock signal SC1 becomes HIGH level, with the master latch section 1 taking in the state of the scan-in signal SIN. Since the scan-in signal is HIGH, the node Na becomes LOW level. Since the second scan clock signal SC2 is LOW, the slave latch section 2 keeps the state as at the time period p1, with the output data signal Q or the scan-out signal SOT not being changed. During the time period p3, as during the time period p1, both the master latch section 1 and the slave latch section 2 keep the previous states, with the output data signal Q or the scan-out signal SOT not being changed.

During the time period p4, the second scan clock signal SC2 becomes HIGH level ((c) of FIG. 8), so that the slave latch section 2 captures the state of the master latch section 1. Since the node Na is LOW, the node Nb is HIGH ((g) of FIG. 8). The scan-out signal SOT also becomes HIGH level with change in the node Nb ((h) of FIG. 8). An output of the slave latch section 2 is supplied to the inverter INV1 via the fourth scan control section 8 and second slave latch section 9. The inverter INV1 inverts the polarity of the signal to output the output data signal Q at LOW level ((j) of FIG. 8).

During the time period p5, the master latch section 1 and the slave latch section 2 keep their previous states, as during the time periods p1 and p3, with the scan-out signal SOT not being changed. When the hold signal H becomes HIGH level ((i) of FIG. 8), the fourth scan control section 8 is in a non-conductive state, with the second slave latch section 9 keeping its previous state. Hence, the output data signal Q keeps its LOW level state. This state continues as long as the hold signal H is at HIGH level. In the present embodiment, the hold signal H is assumed to be set in HIGH level during the time period p5. However, any timing will do. Such timing when the second scan clock signal SC2 is LOW, with the slave latch section 2 then holding its state, is preferred.

During the time period p6, the first scan clock signal SC1 becomes HIGH level and, as during the time period p2, the master latch section 1 captures the scan-in signal SIN, with the node Na becoming HIGH level ((f) of FIG. 8). The state of the slave latch section 2 is not changed because the second scan clock signal SC2 is LOW ((g) of FIG. 8). During the time period p7, the states of the master latch section 1 and the slave latch section 2 are not changed because the first scan clock signal SC1 and the second scan clock signal SC2 are LOW.

During the time period p8, the second scan clock signal SC2 goes HIGH level ((c) of FIG. 8), with the slave latch section 2 taking in an output of the master latch section 1. Consequently, the node Na of the master latch section 1 is HIGH ((f) of FIG. 8), and hence the node Nb is at LOW level ((g) of FIG. 8). The scan-out signal SOT goes LOW with changes in the node Nb ((h) of FIG. 8). Since the hold signal H is HIGH, the fourth scan control section 8 is in a non-conductive state, with the second slave latch section 9 holding its previous state. Consequently, the output data signal Q is kept LOW ((j) of FIG. 8). Thus, in case the hold signal H is HIGH, the second slave latch section 9 keeps its previous state, with the output data signal Q not being coincident with the state of the slave latch section 2.

During the time period p9, both the first scan clock signal SC1 and the second scan clock signal SC2 are at LOW level ((b) and (c) of FIG. 8), so that neither the master latch section 1 nor the slave latch section 2 is changed. If, in this state, the hold signal H is changed to LOW level ((i) of FIG. 8), the transfer gate TG81 is in a conductive state, while the transfer gate TG91 is in a non-conductive state. Hence, the state of the node Nb of the slave latch section 2 ((g) of FIG. 8) is supplied via the first scan control section 4 and second slave latch section 9 to the inverter INV1, with the output data signal Q becoming HIGH level ((j) of FIG. 8).

Under this condition, the clock signal C becomes LOW level during the time period p10. Since the transfer gate TG11 is in the non-conductive state, and the transfer gate is in a conductive state, the master latch section 1 captures the input data signal D. Since the input data signal D is LOW, at this time ((d) of FIG. 8), the node Na of the master latch section 1 becomes LOW level ((f) of FIG. 8). In the slave latch section 2, since the transfer gate TG21 is in a conductive state and keeps its previous state, the state of the node Nb is not changed ((g) of FIG. 8). Moreover, since the hold signal H is at LOW level, the state of the node Nb is supplied via the fourth scan control section 8 and second slave latch section 9 to the inverter INV1, with the output data signal Q not being changed ((j) of FIG. 8). That is, during the time period p10, the master latch section 1 has taken in the input data signal D as the output data signal Q is not changed.

During the time period p11, the clock signal C is HIGH, while the first scan clock signal SC1, second scan clock signal SC2 and the hold signal (H) are LOW. The master latch section 1 and the slave latch section 2 keep their previous states, as during the time period p3, with the second slave latch section 9 directly outputting the output of the slave latch section 2.

During the time period p12, the second scan clock signal SC2 becomes HIGH level ((c) of FIG. 8). The master latch section 1 holds its previous state (the state of holding the input data signal D taken in during the time period p10). The slave latch section 2 captures the output of the master latch section 1, with the node Nb being at HIGH level ((g) of FIG. 8). Hence, the scan-out signal SOT is also at HIGH level ((h) of FIG. 8). Since the hold signal H is LOW, the output data signal Q is LOW ((j) of FIG. 8). That is, the data supplied to the scan flip-flop during the period p1 by the input data signal is reflected at time period p12 in the scan-out signal SOT and in the output data signal Q.

In this manner, the scan flip-flop captures the scan-in signal SIN, when the first scan clock signal SC1 is at HIGH level, while outputting the signal as scan-out signal SOT when the second scan clock signal SC2 is at HIGH level. When the hold signal is at HIGH level, the output data signal Q holds its previous state, without reflecting the state of the slave latch section 2. Also, when the first scan clock signal SC1 and the second scan clock signal SC2 are at LOW level, the state of the input data signal may be set in the master latch section 1 by temporarily setting the clock signal C to LOW level.

The operation of the delay fault test will now be described, taking the case of serially interconnecting three scan flip-flops to make up a scan path as an example. Referring to FIG. 9, scan flip-flops 11, 12 and 13 make up a scan path. There is a combinational circuit 18, as a test circuit, between the scan flip-flop 11 and the scan flip-flop 12, while there is a combinational circuit 19, as another test circuit, between the scan flip-flop 12 and the scan flip-flop 13. The clock signal C, first scan clock signal SC1, second scan clock signal SC2 and the hold signal H are connected common to the scan flip-flops 11 to 13. The scan flip-flop 11 outputs an output data signal Q11 to the combinational circuit 18, which combinational circuit 18 routes a result signal D18, indicating the results of the operation, as input data signal to the scan flip-flop 12. The scan flip-flop 12 outputs an output data signal Q12 to the combinational circuit 19, which combinational circuit 19 routes a result signal D19, indicating the results of the operation, as input data signal to the scan flip-flop 13. During scan path testing, the scan-in signal SI, which is serial test data, is routed to the terminal SIN of the scan flip-flop 11. The terminal SOT of the scan flip-flop 11 is connected to the terminal SIN of the scan flip-flop 12, the terminal SOT of which is connected to the terminal SIN of the scan flip-flop 13. The terminal SOT of the scan flip-flop 13 outputs a scan-out signal SO which is the test result signal. Here, the circuit being tested for delay fault is assumed to be the combinational circuit 19. An output signal Q12 of the scan flip-flop 12 is varied within a preset time interval and the test result is captured by the scan flip-flop 13.

FIG. 10 is a timing chart showing the operation during the delay fault test. The test data, set by the scan-in signal SI in each scan flip-flop, includes two patterns for delay fault testing. The data of the first pattern are "A", "B" and "C", whilst the data of the second pattern are "A", "B" and "C". The first pattern data "B" is set in the scan flip-flop 12 and is changed at a preset timing to the second pattern data "B". The scan flip-flop 13 captures the result signal D19 of the second pattern to output the signal as a can-out signal SO to detect the delay fault of the combinational circuit 19.

The clock signal C is fixed at HIGH level, in order to set test data of the first pattern in each scan flip-flop ((a) of FIG. 10). The first scan clock signal SC1 and the second scan clock signal SC2 give HIGH level pulses SC1a, SC2a, SC1b, SC2b, SC1c and SC2c ((b) and (c) of FIG. 10). At this time, the hold signal H is fixed at LOW level ((d) of FIG. 10). When the first scan clock signal SC1 is at HIGH level, the master latch section 1 of each scan flip-flop captures the data at the terminal SIN, so that the scan-in signal SI gives a data string "A", "B" and "C", in synchronization with the falling of the second scan clock signal SC2 ((e) of FIG. 10).

Each scan flip-flop outputs its captured data in synchronization with the rising of the second scan clock signal SC2. Hence, the scan-out signal SO11 of the scan flip-flop 11 becomes "A", "B" and "C", in synchronization with the rising of the pulse SC2a, pulse SC2b and the pulse SC2c, respectively ((f) of FIG. 10). The scan flip-flop 11 also outputs an output data signal Q11, which is reverse phased with respect to the scan-out signal SO11, that is, "An", "Bn" and "Cn", in synchronization with the rising of the second scan clock signal SC2 ((g) of FIG. 10).

In similar manner, the scan flip-flop 12 outputs a scan-out signal SO12, in synchronization with the rising of the second scan clock signal SC2. The scan-out signal SO12 becomes "A" and "B" in synchronization with the rising of the pulse SC2b and with that of the pulse SC2c, respectively ((i) of FIG. 10). On the other hand, the output data signal Q12 of the scan flip-flop 12 becomes "An" and "Bn" in synchronization with the rising of the pulse SC2b and with that of the pulse SC2c, respectively ((j) of FIG. 10). The scan-out signal SO of the scan flip-flop 13 becomes "A" in synchronization with the rising of the pulse SC2c ((1) of FIG. 10). Hence, the scan flip-flops 11, 12 and 13 output "C", "B" and "C", respectively, in synchronization with the rising of the pulse SC2c of the scan clock signal SC2, indicating that data for test has been set in each of the scan flip-flops. At this time, the combinational circuits 18 and 19 output the result signals D18 ("A1n", "B1n" and "C1n") and D19 ("A2n" and "B2n"), respectively ((h) and (k) of FIG. 10). However, these result signals are not captured by the scan flip-flops 12 and 13.

At a time point when the first-pattern data has been set in and output from each scan flip-flop, the hold signal H is set at HIGH level ((d) of FIG. 10). The first scan clock signal SC1 and the second scan clock signal SC2 give HIGH level pulses SC1d, SC2d, SC1e, SC2e, SC1f and SC2f, in order to set the second pattern data in each flip-flop ((b) and (c) of FIG. 10). The respective scan flip-flops capturing the scan-in signal SIN or outputting the scan-out signal SOT is not affected by the hold signal H. Thus, the scan-in signal SIN gives a data sequence "A", "B" and "C" in synchronization with the falling of the second scan clock signal SC2 ((e) of FIG. 10).

Each scan flip-flop outputs the captured data in synchronization with the rising of the second scan clock signal SC2. Hence, the scan-out signal SO11 of the scan flip-flops 11 becomes "A", "B" and "C" in synchronization with the rising of the pulses SC2d, SC2e and SC2f, respectively ((f) of FIG. 10). In similar manner, the scan flip-flop 12 outputs scan-out signals SO12 "C", "A" and "B" ((i) of FIG. 10), while the scan flip-flop 13 outputs scan-out signals SO "B", "C" and "A" ((l) of FIG. 10), in synchronization with the rising of the second scan clock signal SC2. That is, at a time point of the pulse SC2f, the slave latch sections 2 of the scan flip-flops 11, 12 and 13 hold data indicating "Cn", "Bn" and "An", respectively. On the other hand, since the hold signal H is at HIGH level, the output data signals Q11, Q12 and SO of the scan flip-flops 11, 12 and 13 output "Cn", "Bn" and "An" which are the values for the time points when the hold signal H becomes HIGH level ((g), (j) and (l) of FIG. 10). Consequently, with the scan flip-flops 11 and 13, the same value is held in the slave latch section 2 and in the second slave latch section 9, however, with the scan flip-flop 12, the slave latch section 2 holds data "Bn", while the second slave latch section 9 holds data "B".

At a preset timing Ca, the hold signal H becomes LOW level ((d) of FIG. 10). The hold state of the second slave latch section 9 of each scan-flip-flop is released and a value so far held by the second slave latch section 9 is output as an output data signal. The output data signal Q12 of the scan flip-flop 12, the slave latch section 2 and the second slave latch section 9 of which are holding different values, is changed from "Bn" to "B'n" ((j) of FIG. 11). Since the input of the combinational circuit 19 is changed at timing Ca, the result signal D19 of the combinational circuit 19 is changed from "B2n" to "B2'n" after time delay td ((k) of FIG. 10).

At a timing Cb, following the time lapse of preset time T as from timing Ca, the clock signal C temporarily falls to LOW level ((a) of FIG. 10). The result signals D18 and D19 are captured and held by the master latch sections 1 of the scan flip-flops 12 and 13, respectively ((h) and (k) of FIG. 10). In FIG. 10, the delay time td is shown to be shorter than the preset time T. This is the case where there is no delay fault. In case there is delay fault, delay time td>delay time T. At a timing Cb, the result signal D19 is not changed and indicates "Bn". Hence, the master latch section 1 of the scan flip-flop 12 holds "Bn". Since the slave latch section 2 keeps its previous state, its output signal is not changed. Meanwhile, it is assumed that data "Xn" is supplied at this time to the scan flip-flop 11 as input data signal D.

After the operational result has been captured by each scan flip-flop, the first scan clock signal SC1 and the second scan clock signal SC2 are supplied in order to output the operational result. Initially, a pulse SC2g is supplied. The data indicating the operational result held by the master latch section 1 is moved to the slave latch section 2 ((c) of FIG. 10). In synchronization with the rising of the pulse SC2g, the scan flip-flop 11 outputs "X" and "Xn" for the scan-out signal SO11 and for the output data signal Q11 ((f) and (g) of FIG. 10), respectively, while the scan flip-flop 12 outputs "C1" and "C1n" for the scan-out signal SO12 and for the output data signal Q12 ((i) and (j) of FIG. 10), respectively. The scan flip-flop 13 outputs "B2'" for the scan-out signal SO ((1) of FIG. 10). At this time point, the operational result "B2'" has been output for the scan-out signal SO.

For outputting the operational results further, the first scan clock signal SC1 and the second scan clock signal SC2 transmit pulses SCg1, SC2h, SC1h and SC2i ((b) and (c) of FIG. 10). In synchronization with the rising of the pulse SC2h, the scan flip-flop 12 outputs "X" for the scan-out signal SO12, while the scan flip-flop 13 outputs "C1" for the scan-out signal SO. The operational result "C1" has now been output for the scan-out signal SO. When the scan flip-flop 13 has output "X" for the scan-out signal SO, in synchronization with the rising of the pulse SC2i, the operational results, captured at timing Cb, have been serially output in their entirety from the scan flip-flop 13.

In this manner, the operational results are serially output for the scan-out signal SO. Thus, by observing the scan-out signal SO, it becomes possible to verify whether or not the operational result is plagued with the delay fault. Although the operation has been described for the three-circuit scan flip-flops, using two patterns, differing only for one data, it is similarly possible to use two patterns, differing for plural data, in a scan path including larger numbers of scan flip-flops. Although the D-flip-flops are taken as examples, in the present embodiment, the flip-flops used may also be T-flip-flops or JK-flip-flops.

As described above, only one out of two patterns for delay fault testing can be held with the scan flip-flops of the related art. Hence, the pattern for delay fault testing has to be generated for a sequential circuit. It is however difficult to generate the pattern for delay fault testing with the sequential circuit. With the scan flip-flops of the present invention, it is possible to hold two patterns for delay fault testing simultaneously. The pattern for delay fault testing may be generated for the combinational circuit. With the combinational circuit, it is easier to generate the pattern for delay fault testing for the combinational circuit than for the sequential circuit, so that it is possible to generate the pattern for delay fault testing in a shorter time.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A scan flip-flop circuit comprising:
   a latch section that includes a master part and a slave part that captures an output of said master part;
   a hold section with a scan control section that captures an inner state of said latch section responsive to a control signal, and a slave latch section that captures and holds an output state of said scan control section;
   a first output node that outputs a first output signal based on said output state; and
   a second output node that outputs a second output signal based on said inner state.

2. The scan flip-flop circuit according to claim 1, wherein said latch section receives first and second input signals and sets said inner state based on said first and second input signals.

3. The scan flip-flop circuit according to claim 2, wherein said latch section includes:
   a first latch section that captures and holds said first and second input signals; and
   a second latch section that captures and holds an output of said first latch section.

4. The scan flip-flop circuit according to claim 3, wherein said first latch section captures said first input signal, responsive to a first clock signal, and captures said second input signal, responsive to a second clock signal.

5. The scan flip-flop circuit according to claim 4, wherein said second latch section captures and holds an output of said first latch section responsive to said first clock signal and a third clock signal.

6. A semiconductor integrated circuit device including the scan flip-flop circuit as set forth in claim 1.

7. A scan flip-flop circuit comprising:
   a master part that captures a first input signal supplied to a first terminal, responsive to a first clock signal, to set an inner state thereof and that captures a second input signal supplied to a second terminal, responsive to a second clock signal, to set said inner state;
   a slave part that captures and holds an output of said master part, responsive to said first and third clock signals;
   a hold section that captures and holds an output of said slave part, responsive to a control signal, said hold section having a scan control section that captures said inner state of said latch section and a slave latch section that captures and holds an output state of said scan control section;
   a first output node that outputs a first output signal based on said output state; and
   a second output node that outputs a second output signal based on said inner state.

8. A semiconductor integrated circuit device including the scan flip-flop circuit as set forth in claim 7.

9. A scan flip-flop circuit comprising:
   a master part that captures a first input signal supplied to a first terminal, responsive to a first clock signal, to set an inner state thereof and that captures a second input signal supplied to a second terminal, responsive to a second clock signal, to set said inner state;
   a slave part that captures and holds an output of said master part, responsive to said first and third clock signals; and
   a hold section that captures and holds an output of said slave part, responsive to a control signal,
   wherein said master part includes:
   a first clock control section that captures said first input signal, supplied to said first terminal, responsive to said first clock signal;

a first scan control section that captures said second input signal, supplied to said second terminal, responsive to said second clock signal; and a master latch section that captures and holds an output of said first clock control section and an output of said first scan control section;

wherein said slave part includes:

a second clock control section that captures an output of said master latch section, responsive to said first clock signal;

a second scan control section that captures an output of said master latch section, responsive to said third clock signal;

a slave latch section that captures and holds an output of said second clock control section and an output of said second scan control section; and a third scan control section that feeds back an output of said slave latch section to an input of said second clock control section, responsive to said third clock signal;

said slave part outputting a first output signal;

and wherein said hold section includes:

a fourth scan control section that captures an output of said slave latch section responsive to said control signal; and a second slave latch section that captures and holds an output of said fourth scan control section;

said hold section outputting a second output signal.

* * * * *